(12) United States Patent
Amemiya et al.

(10) Patent No.: US 8,063,652 B2
(45) Date of Patent: Nov. 22, 2011

(54) PROBING APPARATUS AND METHOD FOR ADJUSTING PROBING APPARATUS

(75) Inventors: Takashi Amemiya, Yamanashi (JP); Syuichi Tsukada, Yamanashi (JP)

(73) Assignee: Tokyo Electron Ltd., Minato-ku (JP)

( * ) Notice: Subject to any disclaimer, the term of this patent is extended or adjusted under 35 U.S.C. 154(b) by 0 days.

(21) Appl. No.: 11/542,759

(22) Filed: Oct. 2, 2006

(65) Prior Publication Data

US 2007/0108996 A1      May 17, 2007

(30) Foreign Application Priority Data

Nov. 11, 2005  (JP) ................................ 2005-327462

(51) Int. Cl.
*G01R 31/20* (2006.01)
(52) U.S. Cl. .................................................. 324/754.11
(58) Field of Classification Search .................. 324/754, 324/754.03, 754.11
See application file for complete search history.

(56) References Cited

U.S. PATENT DOCUMENTS

| | | | |
|---|---|---|---|
| 6,799,976 B1 | 10/2004 | Mok et al. | |
| 7,075,319 B2* | 7/2006 | Mori | 324/750.25 |
| 7,230,437 B2* | 6/2007 | Eldridge et al. | 324/754 |
| 7,368,930 B2* | 5/2008 | Hobbs et al. | 324/758 |
| 2003/0080763 A1* | 5/2003 | Yu et al. | 324/758 |
| 2003/0099097 A1 | 5/2003 | Mok et al. | |
| 2005/0174133 A1* | 8/2005 | Lou et al. | 324/754 |
| 2005/0275418 A1* | 12/2005 | Chong et al. | 324/758 |
| 2006/0022686 A1* | 2/2006 | Fan et al. | 324/754 |
| 2008/0048698 A1 | 2/2008 | Amemiya et al. | |

FOREIGN PATENT DOCUMENTS

| | | |
|---|---|---|
| JP | H05-264589 A | 10/1993 |
| JP | H06-061318 A | 3/1994 |
| JP | H06-163656 A | 6/1994 |
| JP | H09-321099 A | 12/1997 |
| JP | H10-26635 A | 1/1998 |
| JP | 2000-067953 A | 3/2000 |
| JP | 2002-184823 | 6/2002 |
| JP | 2003-179110 A | 6/2003 |
| JP | 2004-077153 A | 3/2004 |
| WO | WO 02/103775 A1 | 12/2002 |
| WO | WO-02-103775 A1 | 12/2002 |

OTHER PUBLICATIONS

Notification of Reasons for Refusal in JP Patent Application No. JP2005-327462, Dispatched on Dec. 21, 2010, Japan Patent Office.

* cited by examiner

*Primary Examiner* — Ha Tran T Nguyen
*Assistant Examiner* — Shaun Campbell
(74) *Attorney, Agent, or Firm* — Masuvalley & Partners

(57) ABSTRACT

The present invention stably maintains contact between probe pins and a wafer. Screws are provided at a plurality of positions in an outer circumferential portion of a printed circuit board. On a lower surface side of the outer circumferential portion of the printed circuit board, a retainer plate is provided, and a bottom end surface of each of the screws is held down with the retainer plate. Turning each of the screws in a state where the bottom end surface of the each of the screws is held down with the retainer plate causes the outer circumferential portion of the printed circuit board to be moved up and down. Adjusting a height of the outer circumferential portion of the printed circuit board by turning each of the screws located at the plurality of positions enables parallelism of the entire probe card with respect to the wafer to be adjusted.

11 Claims, 6 Drawing Sheets

PROBING APPARATUS AND METHOD FOR ADJUSTING PROBING APPARATUS

TECHNICAL FIELD

The present invention relates to probing apparatus for examining electrical characteristics of an examination object and a method for adjusting the probing apparatus.

BACKGROUND OF INVENTION

Examinations of electrical characteristics of an electronic circuit such as an IC or an LSI formed on a semiconductor wafer have been carried out by the use of a probe card attached to probing apparatus. The probe card typically comprises a contactor supporting a large number of probe pins and a circuit board electrically connected to the contactor. The examinations of the electrical characteristics of the wafer have been carried out in such a way that electrodes of the wafer are brought into contact with the probe pins, and an electrical signal for the examinations from the circuit board is transmitted/received to/from the wafer through the contactor and the probe pins.

Meanwhile, to properly and stably carry out the above-described examinations of the electrical characteristics, it is necessary to stabilize the contacts between the probe pins and the wafer. In order to provide this, interposing a vertically movable connecting ring between the contactor and the circuit board has been proposed, and the proposal includes Japanese published unexamined patent application No. H05-264589.

To stabilize the contacts between the wafer and the probe pins, it is necessary not only to absorb the distortion and inclination that arise at the time of manufacture processing and are inherent in the circuit board and the contactor, but also to accommodate the distortion and inclination of the entire probe card with respect to the wafer that arise when the probe card is attached to the probing apparatus. However, with the use of the above-described connecting ring, the distortion and inclination of the entire probe card have not been able to be accommodated, and therefore the contacts between the wafer and the probe pins have not been able to be sufficiently stabilized.

The present invention has been made in consideration of such a point, and it is therefore an object of the present invention to sufficiently stabilize the contacts between an examination object such as the wafer and the probe pins.

BRIEF SUMMARY OF THE INVENTION

The present invention for accomplishing the above object is probing apparatus for examining electrical characteristics of an examination object, characterized by having: a probe card comprising a contactor supporting on its under surface probe pins to be brought into contact with the examination object, and a circuit board arranged on an upper surface side of the contactor and communicating with the examination object through the probe pins and the contactor; and a mechanism for adjusting parallelism of the entire probe card with respect to the examination object.

According to the present invention, the mechanism enables distortion and inclination of the entire probe card with respect to the examination object to be corrected. This enables contacts between the examination object and the probe pins to be stabilized.

The probing apparatus may have a fitting part on a main body side of the probing apparatus, the fitting part sized to be fitted with an outer circumferential portion of the probe card, wherein the mechanism may comprise screws provided at a plurality of positions in the outer circumferential portion of the probe card, and may be configured to be able to move up and down the outer circumferential portion of the probe card with respect to the fitting part by turning the screws.

The screws may be vertically provided in an outer circumferential portion of the circuit board, and enable to move up and down the circuit board with respect to the screws by being turned, the mechanism may have a retainer member for holding down a bottom end surface of each of the screws, and the retainer member may be fixed to the fitting part. In addition, the retainer member may be directly fixed to the fitting part, or indirectly fixed to it.

An upper surface of the outer circumferential portion of the circuit board may be provided with a screw fitting member fixed to the circuit board, the screw fitting member may be formed with a screw hole into and through which each of the screws is screwed and penetrates vertically, the outer circumferential portion of the circuit board may be formed with a through-hole through which the each of the screws having penetrated through the screw hole vertically penetrates, and the retainer member may be arranged below the through-hole.

The fitting part may be located on the upper surface side of the outer circumferential portion of the circuit board, and the retainer member may be connected to the fitting part through a connecting body vertically penetrating through the outer circumferential portion of the circuit board.

The screws may be arranged at equal spaces on one circumference of a circle of which a center coincides with a center of the probe card as viewed from a plan view. Also, the screws may be arranged at three or more positions.

Each of the screws may be provided with a nut for holding down the circuit board from above.

The probing apparatus may have stopper mechanisms for regulating an upward movement of the probe card.

Each of the stopper mechanisms may be configured to have a stopper screw vertically penetrating through the outer circumferential portion of the circuit board and fixed to the fixing part at a bottom end part of the stopper screw, and a stopper nut for holding down the circuit board from above, the stopper nut being provided on the stopper screw.

The stopper mechanisms may be provided on both sides of each of the screws as viewed from a plan view.

The probe card may be provided with an interposing body that is interposed between the contactor and the circuit board, makes an electrical connection between the contactor and the circuit board, and has vertical elasticity.

Probing apparatus comprising a contactor supporting probe pins on its lower surface, and a probe card transmitting/receiving to/from the probe pins through the contactor, is characterized in that screws for adjusting parallelism of the probe card and screws for fixing the probe card are separately provided.

The above-described screws for fixing the probe card may provide more than mechanisms for adjusting the parallelism of the probe card.

The above-described screws may be characterized by being arranged at equal spaces on one circumference of a circle of which a center coincides with a center of the probe card as viewed from a plan view.

Stopper mechanisms for regulating an upward movement of the probe card may be provided.

Each of the stopper mechanisms may be characterized by having a stopper screw vertically penetrating through an outer circumferential portion of the circuit board and fixed to the fixing part at a bottom end part of the stopper screw, and a stopper nut for holding down the circuit board from above, the stopper nut being provided on the stopper screw.

The above-described stopper mechanisms may be provided on both sides of each of the screws as viewed from a plan view.

Alternatively, as another invention, there exists a method for adjusting probing apparatus having a probe card comprised of a plurality of probe pins and a printed circuit board, and the method comprises the steps of: loosening a plurality of screws for adjusting parallelism of the probe card to thereby move the printed circuit board up and down; fixing the plurality of screws for adjusting parallelism of the probe card after a position of the printed circuit board has been adjusted; and fixing the probe card with screws that are provided separately from and independently of the screws for adjusting parallelism of the probe card and provided more than the screws for adjusting parallelism of the probe card in number.

The present invention enables contacts between the probe pins and the examination object to be stabilized, and electrical characteristics of the examination object to be examined with high accuracy.

DETAILED DESCRIPTION OF INVENTION

Figure 1:
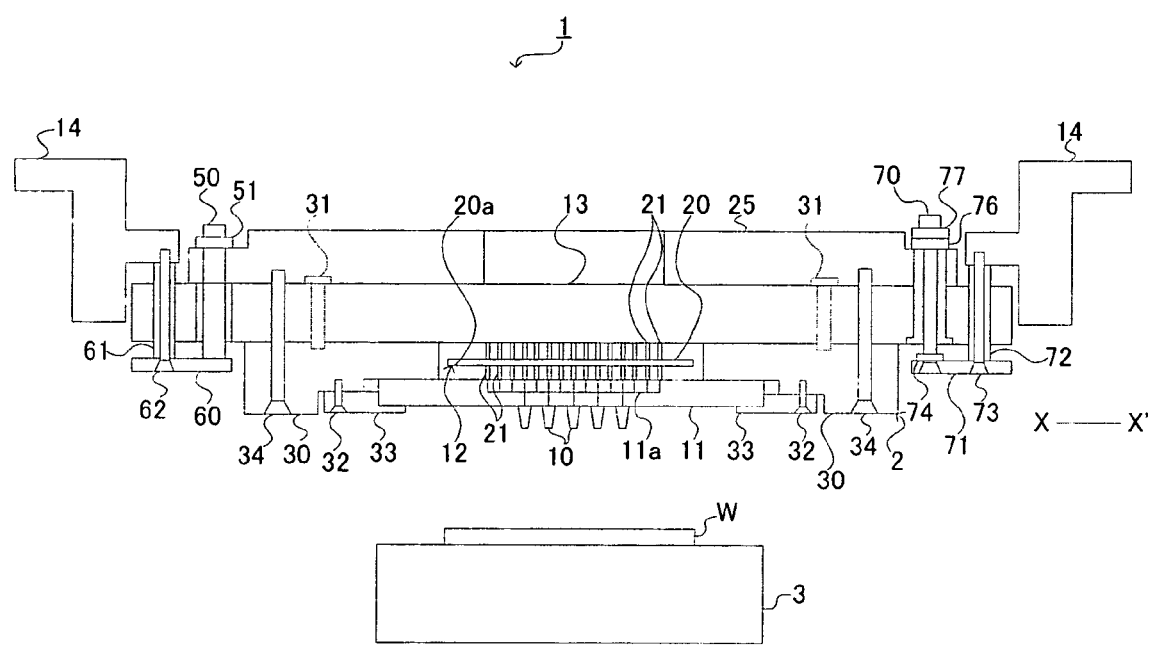
FIG. 1 is a vertical cross-sectional illustration showing an outline of a configuration of probing apparatus.

A preferred embodiment of the present invention will hereinafter be described. FIG. 1 is a vertical cross-sectional illustration showing an outline of a configuration of probing apparatus 1 according to the present invention.

The probing apparatus 1 is provided with, for example, a probe card 2 and a placing stage 3 onto which a wafer W as an examination object is to be placed. The probe card 2 is formed, for example, in a substantially disk shape in its entirety and provided above the placing stage 3 so as to face an upper surface of the placing stage 3.

The probe card 2 comprises, for example, a contactor 11 supporting a plurality of probe pins 10, an interposer 12 as an interposing body, and a printed circuit board 13 as a circuit board, sequentially from the bottom. The probe card 2 is attached to a main body of the probing apparatus 1 with the use of a card holder 14 as a fitting part that is arranged around the probe card 2.

The contactor 11 is formed, for example, in a substantially disk shape, and provided on a lower surface of the probe card 2. At predetermined positions on the lower surface of the contactor 11, the plurality of probe pins 10 are bonded and supported. Inside of the contactor 11, connecting lines 11a for making electrical connections between the respective probe pins 10 on the lower surface side and the interposer 12 on the upper surface side are provided.

The interposer 12 is comprised of, for example, a plate-like holding member 20 and a plurality of contacting parts 21 attached to both upper and lower surfaces of the holding member 20. The contacting parts 21 are convexly projected, for example, from the respective surfaces of the holding member 20. The contacting parts 21 on the lower surface side come into contact with the contactor 11, and the contacting parts 21 on the upper surface side come into contact with the printed circuit board 13. The contacting parts 21 on the lower surface side and the contacting parts 21 on the upper surface side are provided in pairs at positions at which they face each other across the holding member 20.

Each of the contacting parts 21 is formed from, for example, electrically conductive rubber. Each of the contacting parts 21 has thus elasticity, and therefore the interposer 12 can be elastic in a vertical direction and absorb distortion and inclination inherent in the contactor 11 and the printed circuit board 13 respectively located below and above it. Also, inside of the holding member 20, an electrically connecting path 20a for making electrical connections between the upper and lower contacting parts 21 is formed. The interposer 12 enables an electrical connection between the contactor 11 and the circuit board 13 through the electrically conducting contacting parts 21 and the electrical connecting path 20a in the holding member 20.

The printed circuit board 13 is formed, for example, in a substantially disk shape, and arranged so as to be substantially parallel to the contactor 11. The printed circuit board 13 has a diameter larger than that of the contactor 11 and is projected outward. Inside of the printed circuit board 13, a circuit for transmitting/receiving an electrical signal for examining electrical characteristics to/from the probe pins 10 is formed.

Figure 2:
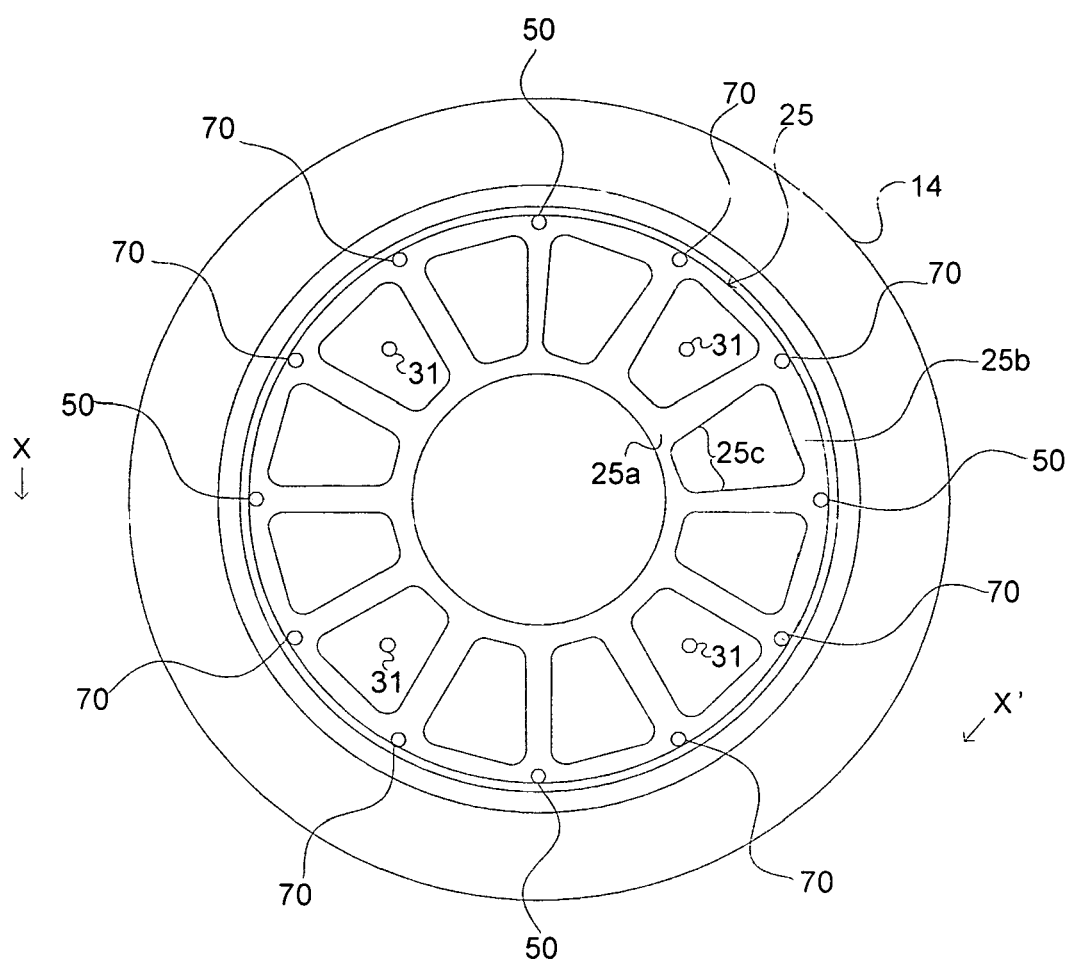
FIG. 2 is a plan view of a probe card.

On an upper surface of the printed circuit board 13, a reinforcing plate 25 for reinforcing the printed circuit board 13 is provided. The reinforcing plate 25 is formed, for example, in a substantially disk shape, and formed from, for example, concentric double ring parts 25a and 25b and a plurality of connecting parts 25c for connecting the ring parts 25a and 25b along the radial direction as shown in FIG. 2. In addition, FIG. 1 shows a vertical cross-section of the probe card 2 taken along the line X-X' shown in FIG. 2.

As shown in FIG. 1, around the contactor 11, for example, a ring-shaped supporting member 30 for supporting an outer circumferential portion of the contactor 11 is provided. The supporting member 30 is fixed to a lower surface of the printed circuit board 13 with the use of, for example, bolts 31. Onto a lower surface of the supporting member 30, flat springs 33 are fixed with bolts 32, and the flat springs 33 support the outer circumferential portion of the contactor 11 from below. The supporting member 30 is provided with bolts 34 that penetrate through the supporting member 30 and the printed circuit board 13 from the lower surface of the supporting member 30 into the reinforcing plate 25. The bolts 34 fix the reinforcing plate 25 onto the upper surface of the printed circuit board 13. In addition, in this embodiment, the reinforcing plate 25 constitutes a screw fitting member to be fixed onto the upper surface of the printed circuit board 13.

The placing stage 3 is configured to be, for example, three-dimensionally movable such as leftward, rightward, upward, and downward. The placing stage 3 enables to elevate the wafer W placed thereon to press it against the probe pins 10 and bring the wafer W in contact with the probe pins 10.

In addition, in this embodiment, the probe card 2 is comprised of, for example, the contactor 11, the interposer 12, the printed circuit board 13, the reinforcing plate 25, the supporting member 30, the bolts 31, 32, and 34, and the plate springs 33.

The probing apparatus 1 is provided with a parallelism adjustment mechanism for maintaining parallelism of the entire probe card 2 with respect to the wafer W and a stopper mechanism for regulating an upward movement of the probe card 2 caused by pressure from below. The parallelism adjustment mechanism and the stopper mechanism are described below.

Figure 3:
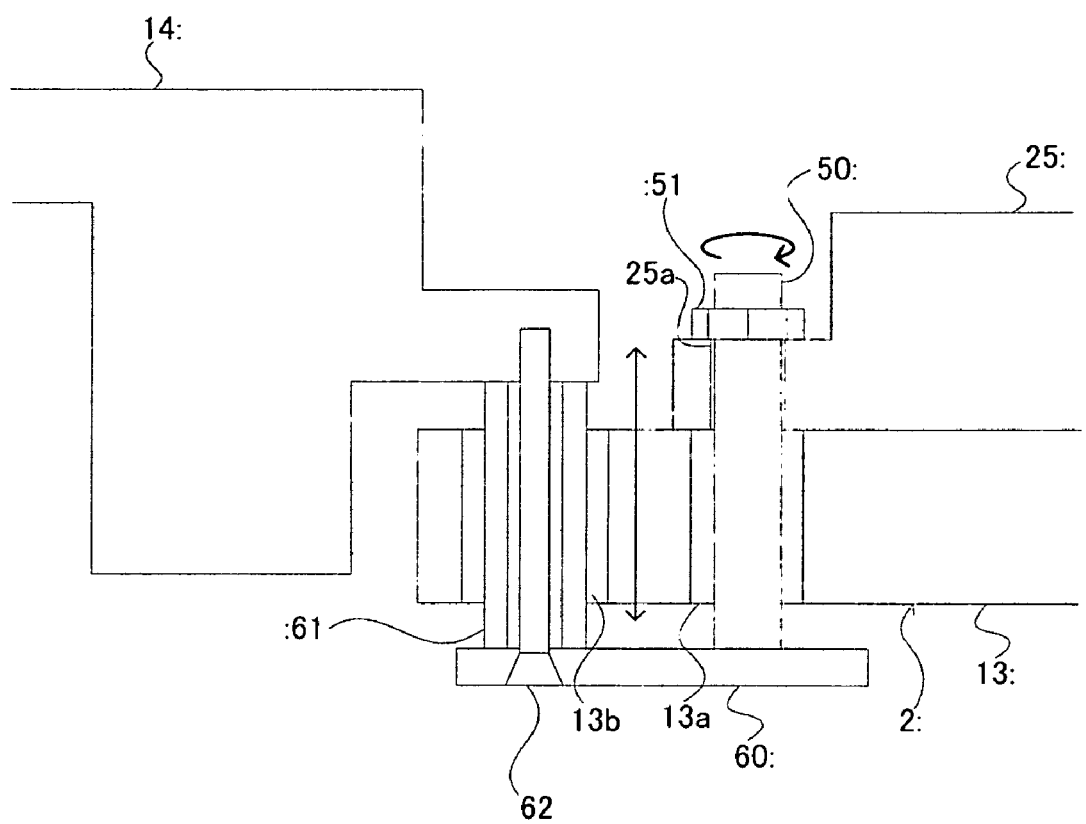
FIG. 3 is a vertical cross-sectional illustration showing an outer circumferential portion of the probe card having a parallelism adjustment mechanism.

For example, as shown in FIGS. 1 and 3, an outer circumferential portion of the printed circuit board 13 of the probe card 2 is provided with screws 50 that vertically penetrate through the reinforcing plate 25 and the printed circuit board 13. The screws 50 are arranged at equal spaces at a plurality of positions on one circumference of a circle of which a center coincides with a center of the probe card 2 as viewed from a plan view as shown in FIG. 2. The screws 50 are arranged, for example at four positions every 90 degrees. As shown in FIG. 3, the screws 50 are, for example, screwed into screw holes 25a in the reinforcing plate 25 as shown in FIG. 3. This enables the reinforcing plate 25 to be vertically moved with respect to the screws 50 if the screws 50 are turned. The screws 50 penetrate through through-holes 13a formed in the printed circuit board 13. Each of the through-holes 13a is formed so as to have a diameter larger than that of each of the screws 50, and therefore the screws 50 are not screwed into the printed circuit board 13. Each of the screws 50 is provided with a nut 51 above the reinforcing plate 25.

On a lower side of the outer circumferential portion of the printed circuit board 13, a retainer plate 60 as a retaining member for holding down a bottom end surface of each of the screws 50 from below is provided. The retainer plate 60 is fixed to the card holder 14. For example, the retainer plate 60 is connected to the card holder 14 overhanging on the upper surface side of the printed circuit board 13, through a spacer 61 as a connecting body. The spacer 61 is formed longer than a thickness of the printed circuit board 13, and maintains constant a space between the card holder 14 and the retainer plate 60. The spacer 61 penetrates through an outer circumferential through-hole 13b that is formed at an outer circumference than a position of the through-hole 13a in the printed circuit board 13. The spacer 61 is formed, for example, in a cylindrical shape, and a bolt 62 inserted into the spacer 61 fixes the retainer plate 60 and the card holder 14.

Turning each of the screws 50 in a state where the bottom end part of each of the screws 50 is held down with the retainer plate 60 enables the outer circumferential portion of the printed circuit board 13 to be moved up and down through the reinforcing plate 25, and thereby a height of the outer circumferential portion of the printed circuit board 13 can be adjusted. Adjusting the height of the outer circumferential portion of the printed circuit board 13 at a position of each of the screws 50 enables the parallelism of the entire probe card 2 to be adjusted.

In this embodiment, the above-described screws 50, nuts 51, retainer plates 60, spacers 61 and bolts 62 constitute the parallelism adjustment mechanism. The parallelism adjustment mechanism is formed in the probe card 2 as described above.

Figure 4:
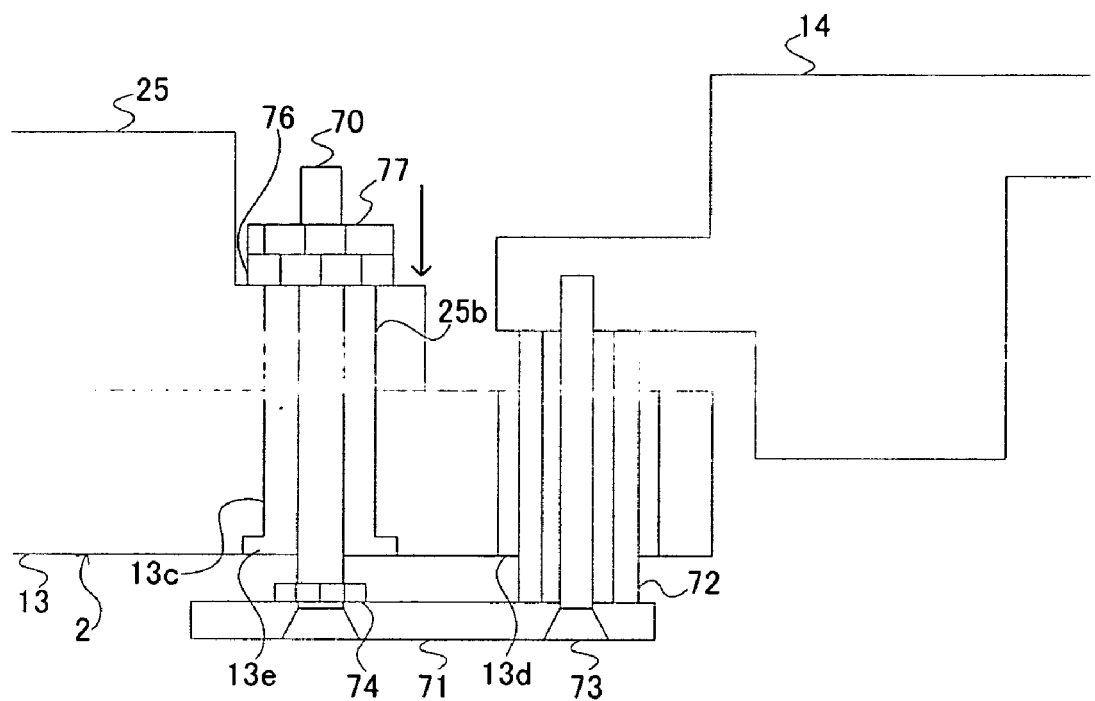
FIG. 4 is a vertical cross-sectional illustration showing an outer circumferential portion of the probe card having a stopper mechanism.

As shown in FIGS. 1 and 4, the outer circumferential portion of the printed circuit board 13 is provided with stopper screws 70 that vertically penetrate through the reinforcing plate 25 and the printed circuit board 13. The stopper screws 70 are provided, for example, at a plurality of positions such as eight positions on the circumference of a circle on which the screws 50 are arranged as shown in FIG. 2. The stopper screws 70 are arranged on both sides of each of the screws 50 so as to interleave each of the screws 50. The stopper screws 70 are arranged on the both sides located, for example, 30 degrees apart from each of the four screws 50.

Each of the stopper screws 70 penetrates through through-holes 25b and 13c both of which are formed vertically in the reinforcing plate 25 and the printed circuit board 13 as shown in FIG. 4. Each of the stopper screws 70 is inserted, for example, into the through-holes 13c and 25b from below such that a head of the screw is downward. A bottom end part of each of the stopper screws 70 is fixed to a fixing plate 71 provided on the lower surface side of the printed circuit board 13. The fixing plate 71 is connected to the card holder 14 overhanging on the upper surface side of the printed circuit board 13, through a spacer 72. The spacer 72 penetrates through an outer circumferential through-hole 13d located further outside of a through-hole 13c in the printed circuit board 13, similarly to the above-described spacer 61. The spacer 72 is formed in a cylindrical shape. Into the spacer 72, a bolt 73 is inserted, and the bolt 73 fixes the fixing plate 71 and the card holder 14. The stopper screws 70 are thus fixed to the card holder 14.

Between the fixing plate 71 for each of the stopper screws 70 and the printed circuit board 13, a nut 74 is fitted. The nut 74 allows each of the stopper screws 70 to be firmly fixed to the fixing plate 71. On the lower surface of the printed circuit board 13, a concave portion 13e that can accommodate the nut 74 is formed. On the upper surface side of the reinforcing plate 25 at a position of each of the stopper screws 70, a stopper nut 76 and a locking nut 77 are sequentially fitted from the bottom. The stopper nut 76 holds down the reinforcing plate 25 and the printed circuit board 13 from above, whereby an upward movement of the probe card 2 can be regulated.

In this embodiment, the stopper mechanism is comprised of, for example, the stopper screw 70, fixing plate 71, spacer 72, bolt 73, nut 74, stopper nut 76, and locking nut 77. The stopper mechanism is formed in the probe card 2.

Figure 5:
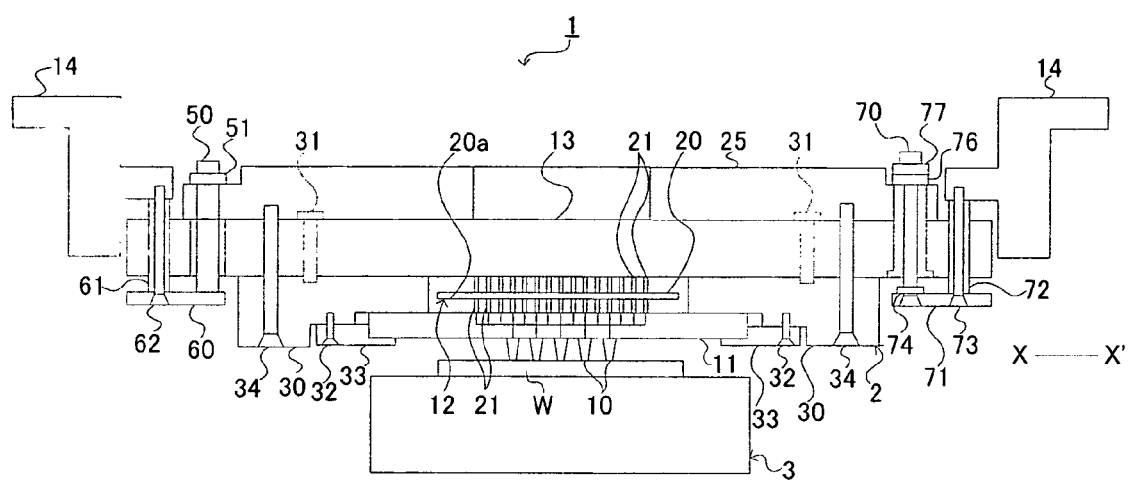
FIG. 5 is a vertical cross-sectional illustration showing the probing apparatus at the time when a wafer is brought into contact with probe pins.

In the probing apparatus 1 configured as above, when electrical characteristics of an electronic device on the wafer W are examined, the wafer W is placed on the placing stage 3, and elevated toward the contactor 11 with the placing stage 3 as shown in FIG. 5. Then, respective electrodes of the wafer W are brought into contact with the corresponding probe pins 10. An electrical signal is transmitted/received to/from the wafer W using the probe pins 10 through the printed circuit board 13, the interposer 12, and the contactor 11, whereby the electrical characteristics of the electronic device on the wafer W are examined.

Figure 6:
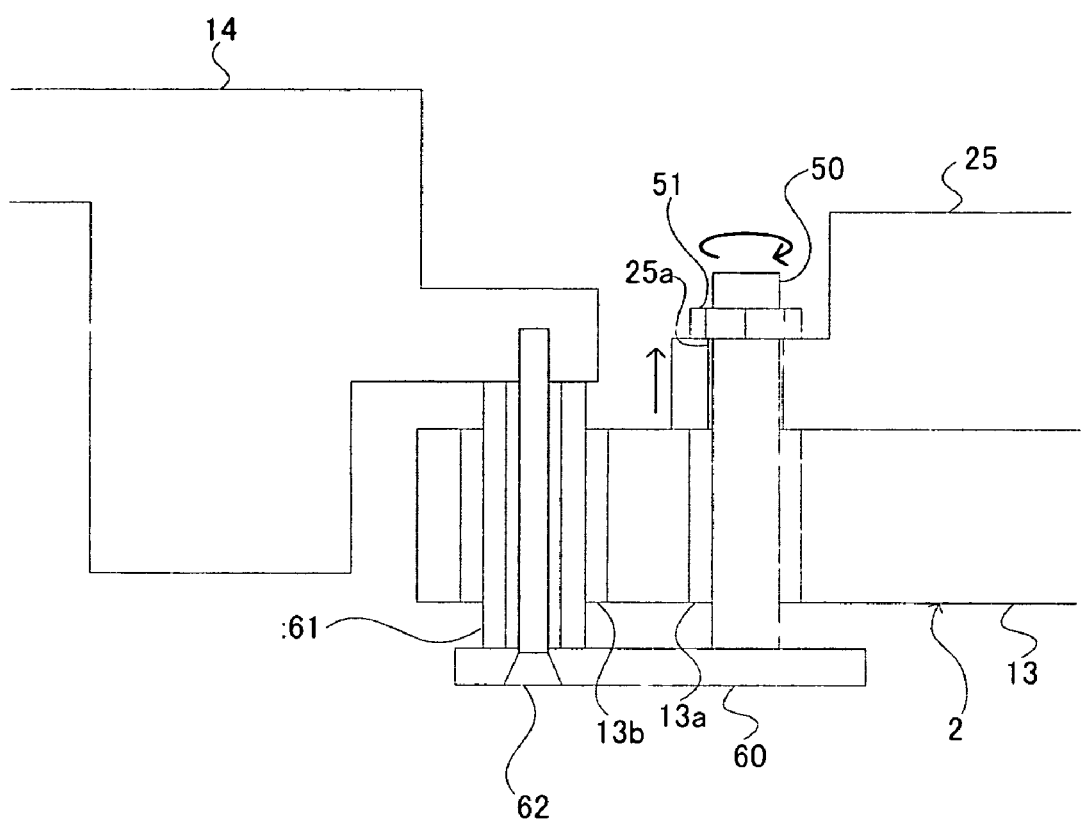
FIG. 6 is a vertical cross-sectional illustration showing the outer circumferential portion of the probe card having the parallelism adjustment mechanism in which nuts are loosened.

Next, adjusting the parallelism of the entire probe card 2 in the probing apparatus 1 is described. The nuts 51 for the respective screws 50 at the four positions, and the stopper nuts 76 and the locking nuts 77 for the respective stopper screws 70 at the eight positions are first loosened. Then, as shown in FIG. 6, each of the screws 50 is turned to thereby adjust a height of the outer circumferential portion of the printed circuit board 13 at a position of each of the screws 50, whereby the entire probe card 2 is adjusted so as to be in a state parallel to the wafer W on the placing stage 3. In this state, the nuts 51 for the respective screws 50 are tightened to thereby fix a position of the printed circuit board 13. Also, as shown in FIG. 4, the stopper nuts 76 and the locking nuts 77 for the stopper screws 70 are tightened to thereby hold down the reinforcing plate 25 and the printed circuit board 13 from above. This enables the probe card 2 to be prevented from being displaced upward when the wafer W is pressed against the probe card 2 as shown in FIG. 5.

According to the above embodiment, the screws 50 provided in the outer circumferential portion of the printed circuit board 13 enable the parallelism of the entire probe card 2 to be adjusted, so that the contactor 11 and the wafer W can be adjusted parallel to each other, and therefore contacts between a surface of the wafer and the probe pins 10 can be stabilized. Also, maintaining parallelism between the wafer W and the probe card 2 does not require, for example, the increase in a vertical width of the interposer 12, so that the interposer 12 and the entire probe card 2 can be miniaturized. Further, an electrical signal response between the contactor 11 and the printed circuit board 13 is not delayed, differently from the case where the vertical width of the interposer 12 is increased, and therefore reductions in examination speed and examination accuracy cannot be prevented.

According to the above embodiment, the plurality of screws 50 are provided at the plurality of positions in the outer circumferential portion of the printed circuit board 13, and the bottom end surface of each of the screws 50 is held down with the retainer plate 60 that is indirectly fixed on the card holder 14 side. Therefore, turning each of the screws 50 enables the outer circumferential portion of the printed circuit board 13 at each of the positions to be moved up and down to thereby adjust the parallelism of the entire probe card 2. The parallelism of the entire probe card 2 can thus be provided by the relatively simple mechanism.

The screws 50 are adapted to be screwed into the reinforcing plate 25 fixed to the printed circuit board 13 and to penetrate through the printed circuit board 13, and therefore threading in the printed circuit board 13 is not necessary, whereby a fabrication of the printed circuit board 13 becomes simplified.

The screws 50 are arranged at equal spaces at a plurality of positions on one circumference of a circle of which a center coincides with a center of the probe card 2 as viewed from a plan view, and therefore the parallelism of the probe card 2 is readily adjusted.

The screws 50 are provided with the nuts 51, so that the printed circuit board 13 can be held down from above. Also, the stopper screws 70 and the stopper nuts 76 are provided at positions different from those of the screws 50 in the outer circumferential portion of the printed circuit board 13, and this also enables the printed circuit board 13 to be held down from above. As a result, even if the wafer W is strongly pressed against the probe pins 10 and thereby the probe card 2 is heavily pressured upward, an upward displacement of the entire probe card 2 can be prevented. In addition, the stopper screws 70 described in the above embodiment may be stud bolts. In such a case, the nuts 74 and the concave portions 13e for the nuts 74 in the printed circuit board 13 are unnecessary.

The stopper screws 70 and the stopper nuts 76 are arranged on both sides of each of the screws 50 so as to interleave it, so that distortions of the printed circuit board 13 at the positions of the screws 50 as supporting points can be suppressed even when pressure is given from below. In addition, the stopper screws 70 and the stopper nuts 76 have been arranged on the both sides of each of the screws 50 on the same circumference of a circle as for the screws 50; however, they are not limited to on the same circumference, but may be arranged on both sides of each of the screws 50 so as to interleave it on a line passing through the screws 50.

The preferred embodiment of the present invention has been described in reference to the accompanying drawings; however, the present invention is not limited to such an example. It should be appreciated that one skilled in the art can think up various variations and modifications within ideas described in claims, and such variations and modifications fall within a technical scope of the present invention. For example, in the above embodiment, the interposer 12 has been provided between the contactor 11 and the printed circuit board 13; however, the interposer 12 may not be provided. Without the use of the interposer 12, the present invention has an advantage of being able to correct distortion and inclination of the probe card 2 with respect to the wafer W. In the above embodiment, the outer circumferential portion of the probe card 2 has been moved up and down with the screws 50; however, it may be moved up and down by the other mechanism. Also, the screws 50 have been screwed into the reinforcing plate 25; however, they may be screwed directly into the printed circuit board 13. Positions and the number of the screws 50, the stopper screws 70 or the stopper nuts 76 are not limited to those in this embodiment, but may be arbitrarily selected. The present invention can also be applied to a case where the examination object is a substrate such as an FPD (flat panel display) other than the wafer W.

The present invention is useful when contacts between probe pins and an examination object is stably maintained. On the other hand, the probing apparatus according to the present invention is not limited to the above-described embodiment, but includes any technologies in which constituent requirements of this embodiment are replaced or added/modified, and all equivalents.

What is claimed is:

1. A probing apparatus for examining electrical characteristics of an examination object, comprising:
   a probe card comprising a contactor supporting on its under surface, a plurality of probe pins to be brought into contact with the examination object, a circuit board arranged on an upper surface side of the contactor and communicating with the examination object through the probe pins and the contactor, and a supporting member supporting the contactor and being fixed to a lower surface of the circuit board, the circuit board being reinforced by a screw fitting member being a reinforcing plate, the screw fitting member arranged on a side of the circuit board opposite to the contactor;
   a mechanism for adjusting a parallelism of the probe card with respect to the examination object, by adjusting a height of an outer circumferential portion of the circuit board, where the contactor and the circuit board are fixed onto the screw fitting member so as to be substantially parallel to each other; and
   a plurality of stopper mechanisms for regulating an upward movement of the probe card, the plurality of stopper mechanisms being disposed on both sides of the mechanism for adjusting a parallelism of the probe card,
   wherein the contactor, the circuit board and the screw fitting member are connected to one another and arranged to be substantially parallel to one another,
   wherein each of the stopper mechanisms has a stopper screw vertically penetrating through an outer circumferential portion of the circuit board and fixed to a fixing part at a bottom end part of the stopper screw, and a stopper nut for holding down the circuit board from above, the fixing part being separate from the supporting member, and the stopper nut being provided on the stopper screw.

2. The probing apparatus according to claim 1, having a fitting part on a main body side of the probing apparatus, the fitting part sized to be fitted with an outer circumferential portion of the probe card, wherein the mechanism comprises a plurality of screws provided at a plurality of positions in the outer circumferential portion of the probe card, and is configured to be able to move up and down the outer circumferential portion of the probe card with respect to the fitting part by turning the screws.

3. The probing apparatus according to claim 2, wherein the screws are vertically provided in an outer circumferential portion of the circuit board, and enable to move up and down the circuit board with respect to the screws by being turned,
the mechanism has a retainer member for holding down a bottom end surface of each of the screws, and the retainer member is fixed to the fitting part.

4. The probing apparatus according to claim 3, wherein a screw fitting member is formed with a screw hole into and through which each of the screws is screwed and penetrates vertically, the outer circumferential portion of the circuit board is formed with a through-hole through which each of the screws having penetrated through the screw hole vertically penetrates, and the retainer member is arranged below the through-hole.

5. The probing apparatus according to claim 3, wherein the fitting part is located on the upper surface side of the outer circumferential portion of the circuit board, and the retainer member is connected to the fitting part through a connecting body vertically penetrating through the outer circumferential portion of the circuit board.

6. The probing apparatus according to claim 2, wherein the screws are arranged at equal spaces on one circumference of a circle of which a center coincides with a center of the probe card as viewed from a plan view.

7. The probing apparatus according to claim 2, wherein the screws are arranged at three or more positions.

8. The probing apparatus according to claim 2, wherein each of the screws is provided with a nut for holding down the circuit board from above.

9. The probing apparatus according to claim 1, wherein the plurality of stopper mechanisms is provided on both sides of the mechanism as viewed from a plan view.

10. The probing apparatus according to claim 1, wherein the probe card is provided with an interposing body that is interposed between the contactor and the circuit board, makes an electrical connection between the contactor and the circuit board, and has vertical elasticity.

11. The probing apparatus according to claim 1, wherein the mechanism and the plurality of stopper mechanisms are disposed on a circumference of the printed circuit.

* * * * *